(12) United States Patent
Rey-Losada et al.

(10) Patent No.: US 9,071,205 B2
(45) Date of Patent: Jun. 30, 2015

(54) SINGLE INPUT CLASS-AB RAIL-TO-RAIL OUTPUT STAGE

(71) Applicant: ANALOG DEVICES, INC., Norwood, MA (US)

(72) Inventors: Daniel Rey-Losada, San Diego, CA (US); Corey Petersen, Poway, CA (US)

(73) Assignee: Analog Devices, Inc., Norwood, MA (US)

( * ) Notice: Subject to any disclaimer, the term of this patent is extended or adjusted under 35 U.S.C. 154(b) by 98 days.

(21) Appl. No.: 13/912,629

(22) Filed: Jun. 7, 2013

(65) Prior Publication Data

US 2014/0361833 A1   Dec. 11, 2014

(51) Int. Cl.
H03F 3/18    (2006.01)
H03F 3/26    (2006.01)

(52) U.S. Cl.
CPC ..................... H03F 3/265 (2013.01)

(58) Field of Classification Search
CPC ............................. H03F 3/301; H03F 3/3001
USPC .................. 330/264, 267, 261, 255
See application file for complete search history.

(56) References Cited

U.S. PATENT DOCUMENTS

| | | | |
|---|---|---|---|
| 4,622,482 A * | 11/1986 | Ganger | 327/410 |
| 6,545,538 B1 | 4/2003 | Ivanov et al. | |
| 6,759,903 B2 * | 7/2004 | Horimoto | 330/253 |
| 6,788,147 B1 * | 9/2004 | Lubbers | 330/264 |
| 7,088,179 B2 | 8/2006 | Gilbert et al. | |
| 7,583,145 B2 * | 9/2009 | Lee | 330/255 |

OTHER PUBLICATIONS

Dennis M. Monticelli, "A Quad CMOS Single-Supply Op Amp With Rail-to-Rail Output Swing," IEEE Journal of Solid-State Circuits, vol. SC-21, No. 6, Dec. 1986, pp. 1026-1034.
Wen-Chung S. Wu et al., "Digital-Compatible High-Performance Operational Amplifier with Rail-to-Rail Input and Output Ranges", IEEE Journal of Solid-State Circuits, vol. 29, No. 1, Jan. 1994, pp. 63-66.
John A. Fisher et al., "A Highly Linear CMOS Buffer Amplifier", IEEE Journal of Solid-State Circuits, vol. SC-22, No. 3, Jun. 1987, pp. 330-334.
Ron Hogervorst et al., "A Compact Power-Efficient 3 V CMOS Rail-to-Rail Input/Output Operational Amplifier for VLSI Cell Libraries", IEEE Journal of Solid-State Circuits, vol. 29, No. 12, Dec. 1994, pp. 1505-1513.

* cited by examiner

Primary Examiner — Henry Choe

(57) ABSTRACT

An amplifier with a single-input class-AB output stage comprises an input stage providing a signal to an output stage. The output stage comprises a current-splitting stage having a bias current and providing at least two intermediate output currents, and a drive stage receiving the two intermediate output currents and driving an output signal having a positive side and a negative side.

20 Claims, 4 Drawing Sheets

SINGLE INPUT CLASS-AB RAIL-TO-RAIL OUTPUT STAGE

CROSS-REFERENCE TO RELATED APPLICATIONS

U.S. Pat. No. 7,088,179, issued Aug. 8, 2006 and entitled "Single-Ended Input, Differential Output Low Noise Amplifier" is incorporated herein by reference.

TECHNICAL FIELD

The present disclosure relates generally to amplifiers, and more particularly to a single-input class-AB rail-to-rail output stage.

BACKGROUND

In an amplifier circuit, it is often desirable for the output signal to have the freedom to swing "rail-to-rail" in operation, meaning that the output should be able to swing close to the upper "supply" voltage, sometimes called "V+" "$V_{CC}$" or "$V_{DD}$," and the lower supply voltage, typically called "ground," "V−," "$V_{SS}$," or "$V_{EE}$." Additionally, it is often desirable that the output stage offer class-AB operation, meaning that the output signal current peak not be limited by the quiescent bias current.

In some applications, output stages having a single input terminal at an input DC voltage close to the supply are critical to the operation of the preceding stage. In the prior art, this may be achieved with a p-type common-gate input stage such as a p-type MOSFET (sometimes called a "pMOS") cascode.

In some prior art amplifiers a signal current out of the cascode device directly controls the control terminal of an output device with no further delay due to non-dominant poles, which helps with high-frequency operation. However, to control the control terminal of the complementary output device, the signal may pass through a "Monticelli" mesh (so called because a mesh of this type was first proposed by Dennis Monticelli, "A Quad CMOS Single-Supply Op Amp with Rail-to-Rail Output Swing," IEEE Journal of Solid-State Circuits, Vol. SC-21, No1. 6, Dec. 1986, incorporated herein by reference). That signal may suffer additional delay. For example, an exemplary prior art device may include a pMOS cascode device with its output connected to the gate of an nMOS output device and a Monticelli mesh which has one terminal connected to that same point and the other terminal connected to the gate of a pMOS output device. For the electrical path that the signal follows to control the gate of the pMOS output device, the Monticelli mesh acts as an n-type cascode with a pole given by the 1/gm of the n-type device within the Monticelli mesh and the total capacitance at the node to which the gate of the nMOS output device is connected. The Monticelli mesh then acts as an additional stage contributing a non-dominant pole when the pMOS gate is driven. In some cases, this may provide additional delay for positive output signals.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
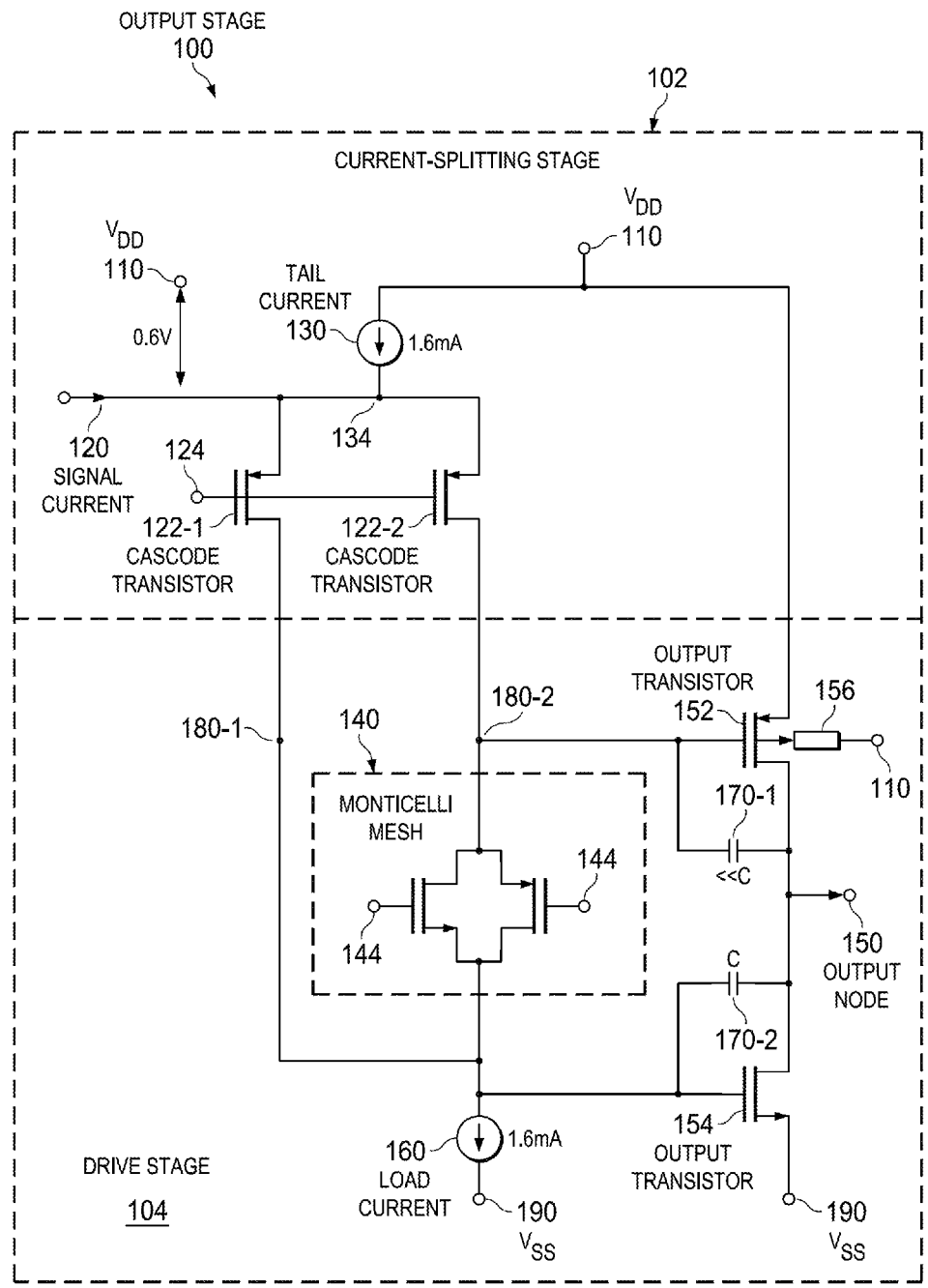
FIG. 1 is a partial electrical schematic of an exemplary embodiment of a rail-to-rail class-AB output stage.

In one aspect, there is disclosed a single-input class-AB output stage comprising: a current-splitting stage comprising: a signal current; a tail current, the signal current and tail current together forming a splitting-stage current; a first cascode three-node transistor wherein the first node receives a cascode biasing voltage, the second node is driven by the splitting-stage current, and the third node provides a first intermediate output current; and a second cascode three-node transistor wherein the first node is biased to the cascode biasing voltage, the second node is driven by the splitting-stage current, and the third node provides a second intermediate output current; whereby the splitting-stage current is split between the second nodes of the cascode transistors and whereby each cascode transistor provides at its third node a current substantially identical to the current provided at its second node; and a drive stage comprising a first intermediate input current receiving the first intermediate output current of the current-splitting stage and a second intermediate input current receiving the second intermediate output current of the current-splitting stage, the first intermediate input current driving a first output three-node transistor and the second intermediate input current driving a second output three-node transistor.

In another aspect, there is disclosed a single-input class-AB output stage comprising: a current-splitting stage having a signal current and a tail current, the sum of the signal current and tail current being an splitting-stage current, and at least one transistor acting as a cascode for the input and providing at least one intermediate output current; and a drive stage comprising at least one intermediate input current supplied by the intermediate output current of the current-splitting stage, the intermediate input current supplying current to a drive circuit including a first output element and a second output element, the second output element having a node in common with the first output element, the common node forming a unified output signal.

In yet another aspect there is disclosed an amplifier comprising an input stage providing a signal current having a positive side and a negative side; and an output stage comprising a current-splitting stage having a tail current and providing at least two intermediate output currents, and a drive stage receiving the two intermediate output currents and driving an output signal having a positive side and a negative side.

DETAILED DESCRIPTION OF EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples and between different figures. This repetition is for the purpose of simplicity and clarity and does not in itself dictate a relationship between the various embodiments and/or configurations discussed.

Because amplifiers in feedback configurations need to be stable for positive and negative output signals, the loop bandwidth needs to be limited to ensure stability for positive and negative signals. This limits important performance metrics such as close-loop bandwidth, distortion, and slew-rate.

In some embodiments, two input currents into the output stage drive both output transistors directly, eliminating the non-dominant pole from the Monticelli mesh. However, this places important constraints on the stage preceding the output stage because the preceding stage must then generate two rather than one drive current.

In an exemplary embodiment of the present specification, a class-AB output stage for an amplifier such as a transconductance amplifier receives only a single signal current. The output stage is subdivided into a current-splitting stage and a drive stage. The current-splitting stage splits the combination of the signal current and a bias current, which can be received from the previous stage or generated within the current-splitting stage, between two cascode transistors, thereby generating two separate intermediate output currents. The two intermediate output currents are provided to a drive stage, which uses one to drive a pMOS transistor to source current, and the other to drive an nMOS transistor to sink current. Because both output transistors are driven directly from the current-splitting stage, the delay to pass through the Monticelli mesh is reduced.

The result is a delay from non-dominant poles that is reduced and much less signal dependent. This allows an increase of the compensating pole frequency by increasing the preceding stage bias current (which increases the transconductance) or by reducing the compensation capacitances. This in turn results into improved closed-loop bandwidth and distortion.

The slew rate is dominated by the peak signal current charging/discharging the capacitance on the gate node for the output transistors. Therefore, increasing the preceding stage bias current, which increases the peak signal current, or reducing the compensation capacitances results into a better and more symmetric slew rate.

Turning now to the figures, FIG. 1 is a partial electrical schematic of an exemplary embodiment of a class-AB output stage 100 according to the present specification. In this embodiment, output stage 100 comprises a current-splitting stage 102 and a drive stage 104.

Current-splitting stage 102 receives a positive supply voltage $V_{DD}$ 110, for example from a dedicated voltage supply or as provided by a preceding circuit stage. Those having skill in the art will appreciate that $V_{DD}$ 110 will have many possible values and that in some embodiments, $V_{DD}$ 110 will be considered a "rail," meaning a maximum voltage for an amplified signal. A negative supply voltage $V_{SS}$ 190 is also shown, and in some embodiments will be considered the opposite "rail," so that at a minimum, no amplified signal can be driven below $V_{SS}$ 190, and at a maximum, no amplified signal can be driven above $V_{DD}$ 110 without an additional voltage converter. By convention, $V_{DD}$ 110 is spoken of as being the most "positive" voltage and $V_{SS}$ 190 is spoken of as being the most "negative" voltage. Thus, under appropriate circumstances, either $V_{DD}$ or $V_{SS}$ could be considered a "supply" or "positive" voltage, and under other circumstances, either $V_{DD}$ or $V_{SS}$ could be considered a "ground," "negative," or "negative supply" voltage. Those having skill in the art will also recognize that $V_{SS}$ 190 need be neither an absolute ground ("earth" or "chassis"), nor necessarily negative with respect to earth or chassis ground. Furthermore, "positive" and "negative" may be understood in the art to refer simply to two opposite sides of a difference in potential. Thus, where a signal has a "positive side" and a "negative side," those with skill in the art will recognize that this may be construed generally to mean that the positive side of the signal includes those portions above a reference voltage, while the negative side of the signal includes those portions below the reference voltage. In some embodiments, a zero point is defined at earth ground or chassis ground and $V_{DD}$ 110 and $V_{SS}$ 190 will have values of substantially the same magnitude but opposite sign. In general terms, a signal may be amplified "rail-to-rail" if the circuit provides the ability to drive the amplified output from a voltage at or near $V_{DD}$ 110 to a voltage at or near $V_{SS}$ 190.

In this exemplary embodiment, a signal current 120 provides an amplified signal from the preceding stage. The input terminal for signal current 120 may be biased to a desired difference in potential from $V_{DD}$ 110. For example, the input terminal for signal current 120 may be biased to 600 mV below $V_{DD}$ 110. A tail current 130 may also be provided and in some embodiments its negative terminal may be biased to the same potential as the input terminal for signal current 120, for example 600 mV below $V_{DD}$ 110. Those having skill in the art will recognize that an output signal thus driven to within a small potential difference of the "rails" may still be considered a "rail-to-rail" amplifier output. Rail-to-rail operation is expressly provided as one option but is not necessary to the operation of output stage 100. Those having skill in the art will also recognize that tail current 130 may be, for example, a dedicated current source or a current sourced by a previous stage of the circuit, or a combination of both, or a combination of current sources. Tail current 130 and signal current 120 are combined to form a single splitting-stage current 134. In this exemplary embodiment, current-splitting stage cascode transistors 122 are biased by tail current 130 to 1.6 mA, and cascode transistors 122 carry this bias current combined with signal current 120, which may be much smaller in magnitude than tail current 130.

Splitting-stage current 134 is provided to two cascode transistors 122, which in this exemplary embodiment are both pMOSs. Cascode transistors 122 receive a bias voltage 124 at their gates. Bias voltage 124 may be an actively- or passively-generated bias voltage. Each cascode transistor 122 provides at its drain node substantially the current provided at its source node, but the drain current is decoupled from the voltage at the drain node. In some embodiments, cascode transistors 122 are intended to be substantially identical and each is configured to receive approximately one-half of splitting-stage current 134, 0.8 mA in the absence of signal in this exemplary embodiment. In other embodiments, the cascode transistors may have differing transconductance values and be configured to each receive a proportional share of the current. For example, if cascode transistor 122-1 has half the transconductance value of cascode transistor 122-2, then cascode transistor 122-1 will receive one-third of the current (for example, 0.53 mA in the absence of signal) and cascode transistor 122-2 will receive two-thirds of the current (for example, 1.07 mA in the absence of signal). Cascode transistor 122-1 provides a first intermediate output current 180-1, and cascode transistor 122-2 provides a second intermediate output current 180-2.

Advantageously, cascode transistors 122 enable output stage 100 to perform as though it had two dedicated input currents.

Figure 3:
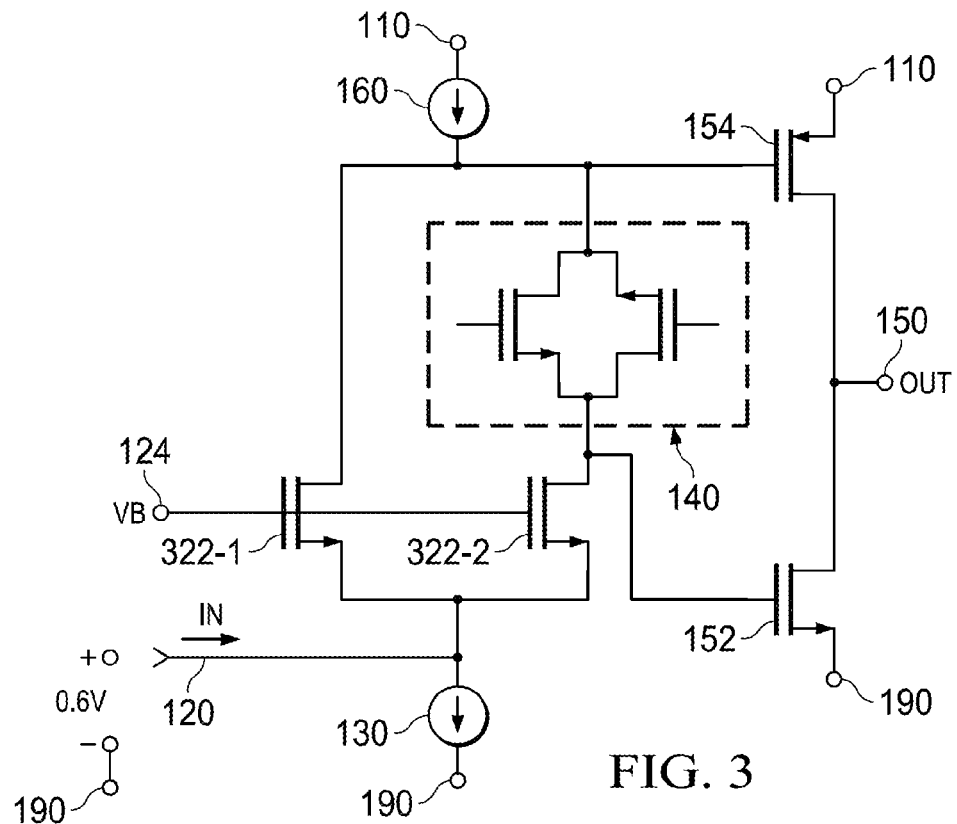
FIG. 3 is a partial electrical schematic of an alternative embodiment of a rail-to-rail class-AB output stage.

Those with skill in the art will recognize that while this exemplary embodiment has been disclosed using p-type transistors for cascode transistors 122, an exactly analogous circuit may be built with n-type cascode transistors by essentially turning the circuit upside-down (see FIG. 3). FIG. 3 shows a circuit analogous to that of FIG. 1 obtained by swapping $V_{DD}$ 110 for $V_{SS}$ 190, changing the n-type transistors for p-type transistors, and inverting the polarity of the current sources. It is intended that the n-type cascode circuit variation be treated as exactly equivalent to the p-type cascode circuit of FIG. 1.

Those with skill in the art will also recognize that although FIG. 1 is disclosed with an exemplary embodiment using MOS FETs, other embodiments may employ other types of non-passive devices with three or more nodes, such as triodes, bipolar junction transistors (BJT), and JFETs by way of non-limiting example. For ease of reference, all such devices are referred to herein as "three-node transistors." In general, a three-node transistor will have at least three nodes, which can be referred to as a first node (base, gate, or similar), second node (source, emitter, or similar), and third node (drain, collector, or similar).

Continuing with FIG. 1, drive stage 104 is configured to receive intermediate input currents 180, which in this exemplary embodiment are identically the intermediate output currents 180 of current-splitting stage 102. Output transistor 152 and output transistor 154 are provided and each has its drain node connected to the drain node of the other. Two intermediate input currents 180 are provided so that the gate nodes of output transistors 152, 154 can each be driven directly. For example, when current signal 120 is positive, the signal current out of the drains of cascode devices 122 is positive, which increases the signal voltage at the gates of output transistor 152 and 154, which reduces the current sourced by output transistor 152 and increases the current sourced by output transistor 154, which decreases the output signal voltage. By driving the gates of output transistors 152, 154 with separate intermediate input currents 180, substantial delays or phase shifts can be avoided in the output signal 150.

In some embodiments, a Monticelli mesh 140 is also provided. Current-splitting stage 102 preliminarily but imperfectly splits splitting-stage current 134 into currents 180-1 and 180-2. This fast but imperfect split is subsequently refined by Monticelli mesh 140. Monticelli mesh 140 may steer a fraction of intermediate input current 180-1 from the node to which the gate of transistor 154 connects to the node to which the gate of transistor 152 connects; similarly, it may steer intermediate input current 180-2 from the gate of transistor 152 to the gate of transistor 154. For example, when current signal 120 is positive, intermediate input currents 180 out of the drains of cascode devices 122 increase, and Monticelli mesh 140 steers any unnecessary fraction of intermediate input current 180-1 from the gate node of output transistor 154 to the gate node of output transistor 152. Similarly, Monticelli mesh 140 steers any unnecessary fraction of intermediate input current 180-2 from the gate node of transistor 152 to the gate node of transistor 154. This steering is subject to some delay but it has negligible impact on the overall delay of the output stage.

Two stability compensation capacitors 170 are provided. An exemplary reference capacitance "C" is used throughout this specification, and stability compensation capacitor 170-1 may be much smaller than C and may be connected to p-type output transistor 152, while stability compensation capacitor 170-2 may be approximately C and may be connected to n-type output transistor 154.

A load current 160 is also shown, connected to the $V_{SS}$-side of Monticelli mesh 140. Load current 160 and tail current 130 together bias cascode devices 122 in the current-splitting stage and Monticelli mesh 140 in the drive stage.

In some embodiments, the voltage range for the DC voltage of the input terminal receiving signal current 120 can be widened by driving the output transistor 152 backgate beyond $V_{DD}$ 110, to increase the source-to-drain voltage across cascode transistor 122-2. For example, charge pump 156 may be used to drive the backgate of output transistors 152 beyond $V_{DD}$ 110, which increases headroom across tail current 130 while maintaining cascode transistors 122 in saturation.

Figure 2:
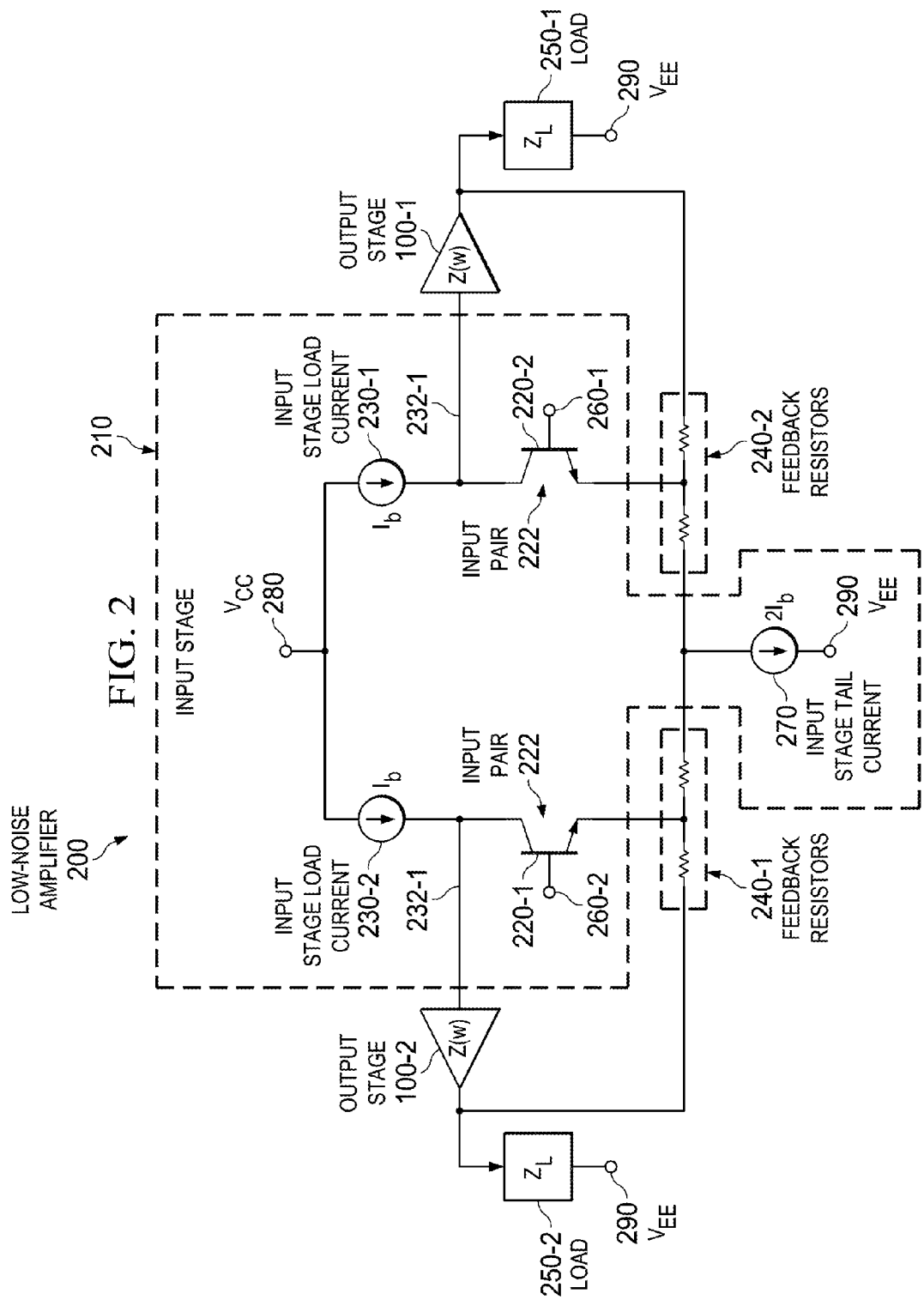
FIG. 2 is a partial electrical schematic of a low-noise amplifier.

FIG. 2 is a partial electrical schematic of a low-noise amplifier 200 disclosing an exemplary use of output stages 100 in situ. This circuit is similar to the one described in U.S. Pat. No. 7,088,179. Low-noise amplifier 200 includes an input stage 210, two output stages 100, with each output stage 100 providing a signal to a load 250, loads for amplifier circuits being well known in the art. In some embodiments, loads 250-1 and 250-2 may be a single load 250, in which case, each output stage 100 will drive one side of load 250.

Two supply voltages are disclosed, $V_{CC}$ 280, and $V_{EE}$ 290. In some embodiments, $V_{CC}$ 280 may substantially match or be the same node as $V_{DD}$ 110, while $V_{EE}$ 290 may substantially match or be the same node as $V_{SS}$ 190. Input stage 210 includes two transistors 220 acting as an input pair 222. In the exemplary embodiment, input pair 222 receives a signal at the bases 260 of transistors 220 and provides current signals 232 which constitute the input current to output stages 100. Input stage load currents 230 and input stage tail current 270 bias the input pair transistors 220, for example to 2.5 mA each.

A resistive feedback network 240 feeds a fraction of the output signal (present at the outputs of output stages 100) back to input stage 210 by injecting the signal at the emitters of transistors 220. Those skilled in the art will recognize that the resistive feedback network shown is just one possible embodiment of possible feedback networks, which may or not be resistive and may or not be configured as a series string of passive devices. At a node in feedback network 240, input stage tail current 270 is provided.

FIG. 3 is a partial schematic of an alternative embodiment of output stage 100. Components of this output stage 100 are functionally identical. In this embodiment, n-type cascode transistors 322 have been substituted for the p-type cascode transistors 122 of FIG. 1 and appropriate modifications, well within the grasp of those having skill in the art, have been made to account for differences in polarity. For example, load current 160 is now connected between $V_{DD}$ 110 and nMOS output transistor 152, while tail current 130 biases n-type cascode transistors 322 and sources current to $V_{SS}$ 190. This alternative embodiment is disclosed to illustrate that an "upside down" version of output stage 100 is the equivalent of the version of FIG. 1. To state expressly what is inherent to the disclosure of this specification, for purposes of the appended claims, any claim that is drawn to output stage 100 as shown in FIG. 1 is also expressly intended to be drawn to output stage 100 as shown in FIG. 3.

Figure 4:
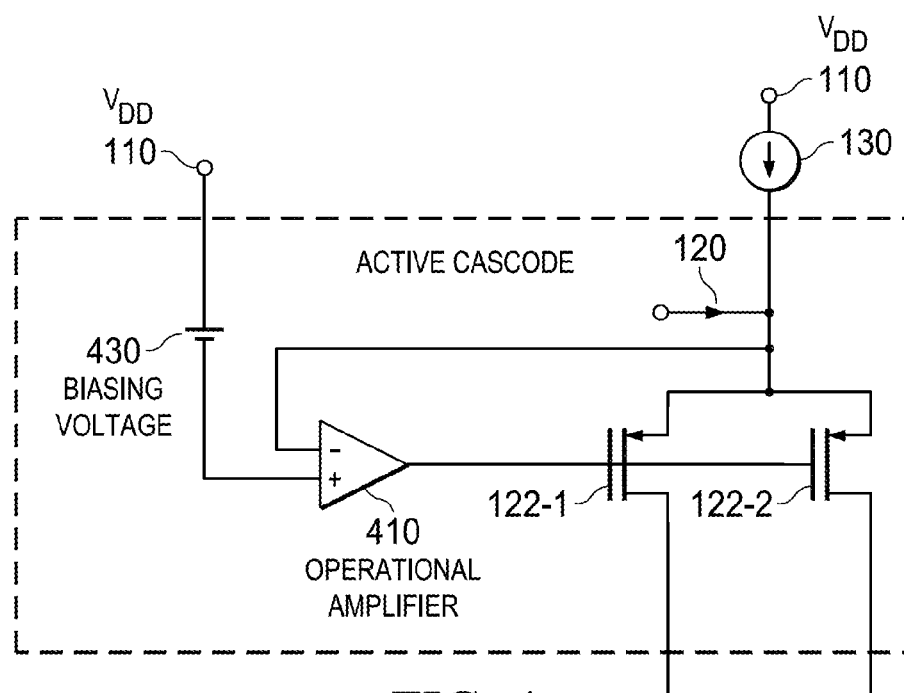
FIG. 4 is a partial electrical schematic illustrating an exemplary method of actively driving a biasing voltage to the gates of cascode transistors.

FIG. 4 is a partial schematic illustrating an exemplary method of actively biasing the gates of cascode transistors 122. In particular, it may be desirable to actively bias the gates to compensate for perturbations in the voltage at the terminal receiving signal current 120. Thus, in this exemplary embodiment, an operational amplifier 410 is provided with DC voltage source 430 generating a DC voltage which is provided to the non-inverting input of operational amplifier 410. The inverting input of operational amplifier 410 connects to the voltage at terminal for signal current 120 to detect perturbations. The output of operational amplifier 410 is provided directly to the gates of cascode transistors 122. Operational amplifier 410 thereby corrects for variations in voltage at the output-stage input terminal that arise as a result of signal current 120.

Figure 5:
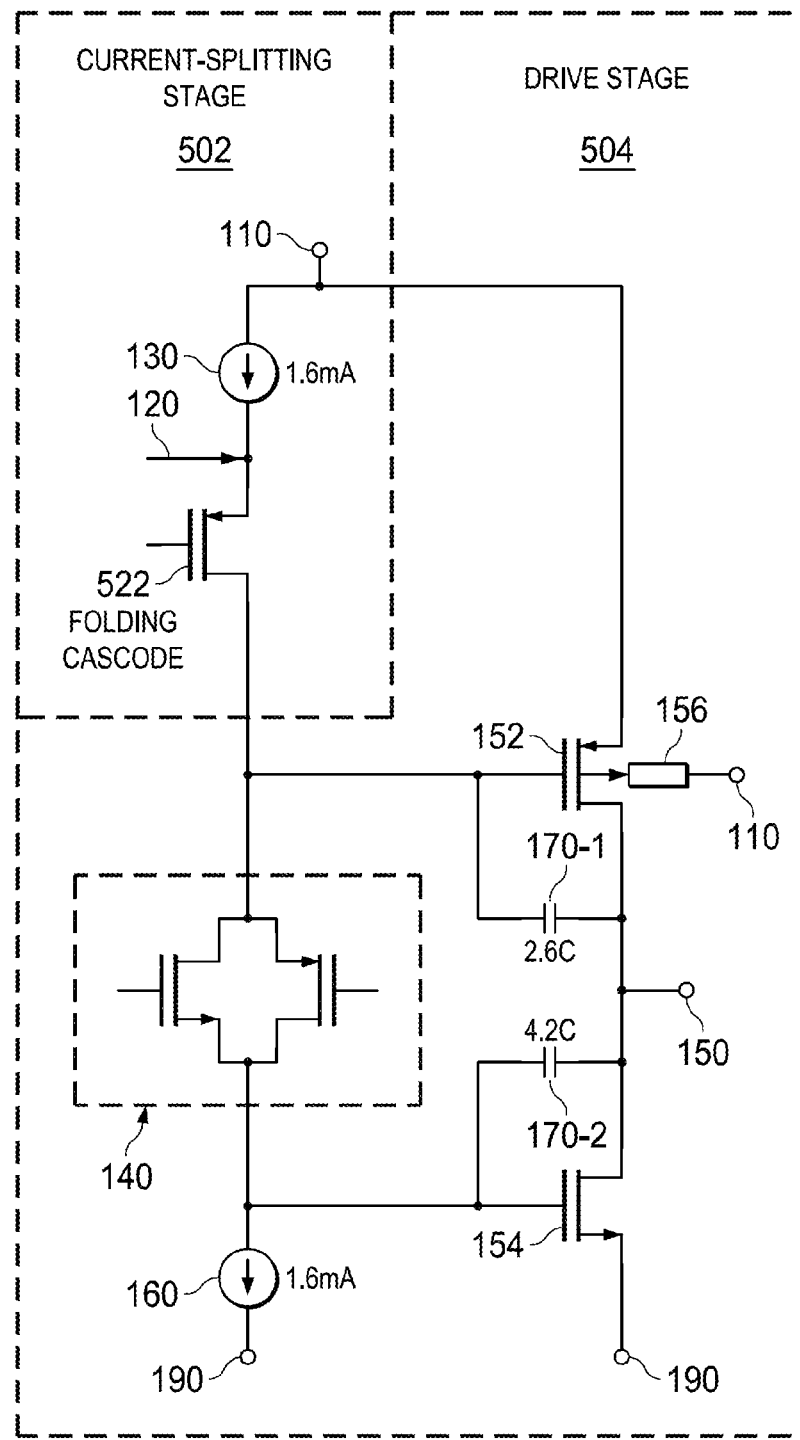
FIG. 5 is a partial electrical schematic disclosing an alternative embodiment of a rail-to-rail class-AB output stage.

FIG. 5 is a partial electrical schematic disclosing an alternative embodiment of an output stage according to the present specification. In this embodiment, current-splitting stage 502 includes a tail current 130. The current from this current source and signal current 120 together drive a single folding cascode 522. This provides a single intermediate output current to drive stage 504.

Drive stage 504 receives a single intermediate input current from folding cascode 522. The current output of folding cascode 522 drives pMOS output transistor 152 directly. A stability compensating capacitor may also be provided at this node, with an exemplary value of 2.6 C.

The current output of folding cascode 522 must pass through Monticelli mesh 140 before reaching nMOS 154 gate. A stability compensation capacitor may also be provided at this node, with an exemplary value of 4.2 C.

In this embodiment, additional delay is experienced in passing through Monticelli mesh 140 to control the nMOS output transistor 154, which translates into larger compensation capacitors (2.6 C and 4.2 C instead of <<C and C) and ultimately into degraded closed-loop bandwidth, distortion, and slew rate.

In operation, exemplary amplifiers built according to the exemplary embodiments of FIG. 1 and FIG. 5 may be compared in simulation to an amplifier design conducted with identical constraints using a prior art output stage.

The design constraints are as follows:
$R_{load}$: 27 Ω
$C_{load}$: 1.6 pF/(50 Ω+4 pF)
Closed-loop gain: 6V/V
Power: 21 mW
Noise: 0.53 nV/√Hz
Stability compensation: 55° phase margin for worst case signal Loop gain @5 MHz symmetric for output source/sink After simulation, the following performances were observed:

|  | Prior art | FIG. 5 | FIG. 1 |
|---|---|---|---|
| Closed-loop BW | 58 MHz | 42 Mhz | 182 MHz |
| Slew rate (+) | 60 MV/s | 45 MV/s | 200 MV/S |
| Slew rate (−) | 100 MV/s | 80 MV/s | 200 MV/S |
| Loop gain at 5 MHz | 19.4 dB | 16.9 dB | 27.1 dB |

Thus, the output stage of FIG. 1 significantly improved on prior art devices, particularly with respect to closed-loop bandwidth, slew-rate, and loop-gain at signal frequencies. Furthermore, the output stage of the present specification is observed to significantly improve on other prior art devices having a closed-loop bandwidth no greater than 58 MHz, a slew rate no greater than 100 MV/s, and loop gain at 5 MHz no greater than 19.4 dB.

In the discussions of the embodiments above, any capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use highprecision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A single-input class-AB output stage comprising:
   a current-splitting stage comprising:
   a signal current;
   a tail current, the signal current and tail current together forming a splitting-stage current;
   a first cascode three-node transistor wherein the first node receives a cascode biasing voltage, the second node is driven by the splitting-stage current, and the third node provides a first intermediate output current; and
   a second cascode three-node transistor wherein the first node is biased to the cascode biasing voltage, the second node is driven by the splitting-stage current, and the third node provides a second intermediate output current;
   whereby the splitting-stage current is split between the second nodes of the cascode transistors and whereby each cascode transistor provides at its third node a current substantially identical to the current provided at its second node; and
   a drive stage comprising a first intermediate input current receiving the first intermediate output current of the current-splitting stage and a second intermediate input current receiving the second intermediate output current of the current-splitting stage, the first intermediate input current driving a first output three-node transistor and the second intermediate input current driving a second output three-node transistor.

2. The output stage of claim 1 further comprising:
   a positive supply voltage and a negative supply voltage; and
   wherein the drive stage further comprises:
   a Monticelli mesh comprising two three-node transistors in which the second node of each transistor is connected to the third node of the other transistor, the Monticelli mesh configured to balance irregularities between the first intermediate input current and second intermediate input current; and
   wherein:
   the first intermediate input current drives the first node of the first output transistor;
   the second intermediate input current drives the first node of the second output transistor; and
   the third node of the first output transistor is connected to the third node of the second output transistor, the two third nodes together comprising a unified output node wherein the first output transistor drives a positive output signal and the second output transistor drives a negative output signal;
   whereby the unified output node is configured to be able to provide rail-to-rail operation.

3. The output stage of claim 2 wherein the first output transistor is a p-type field-effect transistor and the second output transistor is an n-type field effect transistor.

4. The output stage of claim 2 wherein the output transistors are bipolar junction transistors.

5. The output stage of claim 2 further comprising a second current source drawing a current substantially identical to the tail current.

6. The output stage of claim 2 further comprising a charge pump connected to a backgate of one of the output transistor and to one of the supply voltages.

7. The output stage of claim 2 wherein the cascode transistors are p-type transistors.

8. The output stage of claim 2 wherein the cascode transistors are n-type transistors.

9. The output stage of claim 2 wherein the cascode transistors are bipolar junction transistors.

10. The output stage of claim 1 wherein the potential of an input terminal of the signal current is biased to approximately 600 mV from a supply voltage.

11. The output stage of claim 1 wherein the potential of an input terminal of the signal current is biased to between 50 mV and 2000 mV from a supply voltage.

12. The output stage of claim 1 wherein the bias voltage of the cascode transistors is actively driven in response to fluctuations in the input current.

13. An amplifier comprising:
an input stage operable to provide a signal current having a positive side and a negative side; and
a class-AB output stage comprising:
a current-splitting stage comprising:
a signal current source operable to provide a signal current;
a tail current source operable to provide a tail current, the signal current and tail current together operable to form a splitting-stage current;
a first cascode three-node transistor wherein the first node is operable to receive a cascode biasing voltage, the second node is operable to be driven by the splitting-stage current, and the third node is operable to provide a first intermediate output current; and a second cascode three-node transistor wherein the first node is biased to the cascode biasing voltage, the second node is operable to be driven by the splitting-stage current, and the third node is operable to provide a second intermediate output current;
whereby the splitting-stage current is operable to be split between the second nodes of the cascode transistors and whereby each cascode transistor is operable to provide at its third node a current substantially identical to the current provided at its second node; and
a drive stage comprising a first intermediate input current operable to receive the first intermediate output current of the current-splitting stage and a second intermediate input current operable to receive the second intermediate output current of the current-splitting stage, the first intermediate input current operable to drive a first output three-node transistor and the second intermediate input current operable to drive a second output three-node transistor.

14. The amplifier of claim 13, wherein the output stage further comprises:
a positive supply voltage and a negative supply voltage; and
wherein the drive stage further comprises:
a Monticelli mesh comprising two three-node transistors in which the second node of each transistor is connected to the third node of the other transistor, the Monticelli mesh configured to balance irregularities between the first intermediate input current and second intermediate input current; and
wherein:
the first intermediate input current is operable to drive the first node of the first output transistor;
the second intermediate input current is operable to drive the first node of the second output transistor; and
the third node of the first output transistor is connected to the third node of the second output transistor, the two third nodes together comprising a unified output node wherein the first output transistor is operable to drive a positive output signal and the second output transistor is operable to drive a negative output signal;
whereby the unified output node is configured to be able to provide rail-to-rail operation.

15. The amplifier of claim 13, wherein the potential of an input terminal of the signal current is biased to approximately 600 mV from a supply voltage.

16. The amplifier of claim 13, wherein the potential of an input terminal of the signal current is biased to between 50 mV and 2000 mV from a supply voltage.

17. A system on a chip, comprising:
a mixed-signal analog-digital network configured to provide an output current; and
an amplifier, comprising:
an input stage providing a signal current having a positive side and a negative side; and
a class-AB output stage comprising:
a current-splitting stage comprising:
a signal current source operable to provide a signal current;
a tail current source operable to provide a tail current, the signal current and tail current together operable to provide a splitting-stage current;
a first cascode three-node transistor wherein the first node is operable to receive a cascode biasing voltage, the second node is operable to be driven by the splitting-stage current, and the third node is operable to provide a first intermediate output current; and
a second cascode three-node transistor wherein the first node is configured to be biased to the cascode biasing voltage, the second node is operable to be driven by the splitting-stage current, and the third node is operable to provide a second intermediate output current;
whereby the splitting-stage current is split between the second nodes of the cascode transistors and whereby each cascode transistor provides at its third node a current substantially identical to the current provided at its second node; and
a drive stage comprising a first intermediate input current source operable to receive the first intermediate output current of the current-splitting stage and a second intermediate input current source operable to receive the second intermediate output current of the current-splitting stage, the first intermediate input current operable to drive a first output three-node transistor and the second intermediate input operable to drive a second output three-node transistor.

18. The system on a chip of claim 17, wherein the output stage further comprises:
a positive supply voltage and a negative supply voltage; and
wherein the drive stage further comprises:
a Monticelli mesh comprising two three-node transistors in which the second node of each transistor is connected to the third node of the other transistor, the Monticelli mesh configured to balance irregularities between the first intermediate input current and second intermediate input current; and
wherein:
the first intermediate input current is operable to drive the first node of the first output transistor;
the second intermediate input current is operable to drive the first node of the second output transistor; and
the third node of the first output transistor is connected to the third node of the second output transistor, the two third nodes together comprising a unified output node wherein the first output transistor is operable to drive a positive output signal and the second output transistor is operable to drive a negative output signal;
whereby the unified output node is configured to be able to provide rail-to-rail operation.

19. The system on a chip of claim 17, wherein the potential of an input terminal of the signal current is biased to approximately 600 mV from a supply voltage.

20. The system on a chip of claim 17, wherein the potential of an input terminal of the signal current is biased to between 50 mV and 2000 mV from a supply voltage.

* * * * *